US006271699B1

(12) United States Patent
Dowlatabadi

(10) Patent No.: US 6,271,699 B1
(45) Date of Patent: *Aug. 7, 2001

(54) DRIVER CIRCUIT AND METHOD FOR CONTROLLING TRANSITION TIME OF A SIGNAL

(75) Inventor: Ahmad Baghai Dowlatabadi, San Jose, CA (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/285,826

(22) Filed: Apr. 2, 1999

(51) Int. Cl.[7] .................................................. H03K 17/16
(52) U.S. Cl. ........................... 327/170; 327/108; 327/379
(58) Field of Search ................................... 327/108, 170, 327/437, 112, 111, 379, 83, 52

(56) References Cited

U.S. PATENT DOCUMENTS

| 4,825,099 | 4/1989 | Barton ................................. 307/270 |
| 4,906,867 | 3/1990 | Petty ................................... 307/443 |
| 5,039,874 | 8/1991 | Anderson ............................. 307/270 |
| 5,436,578 | 7/1995 | Brown et al. ......................... 326/87 |
| 5,451,861 | 9/1995 | Giebel ................................. 323/315 |
| 5,547,887 | 8/1996 | Brown et al. ......................... 437/51 |
| 5,598,119 | 1/1997 | Thayer et al. ....................... 327/111 |
| 5,771,389 | 6/1998 | Swartz .............................. 395/750.01 |
| 5,834,955 | 11/1998 | Eichfeld et al. ..................... 327/108 |
| 5,905,389 | * 5/1999 | Alleven ............................... 327/108 |

OTHER PUBLICATIONS

"Application Specific CMOS Output Driver Circuit Design Techniques to Reduce Simultaneous Switching Noise", R. Senthinathan and J.L. Prince, IEEE Journal of Solid–State Circuits, vol. 28, No. 12, Dec. 1993, pp. 1383–1388.
"Design and Characterization of a CMOS Off–Chip Driver/Receiver with Reduced Power–Supply Disturbance", Hussein I. Hanafi et al., IEEE Journal of Solid–State Ciruits, vol. 27, No. 5, May 1992, pp. 783–791.
"High–Speed, Low–Switching Noise CMOS Memory Data Output Buffer", Ernestina Chioffi et al., IEEE Journal of Solid–State Circuits, vol. 29, No. 11, Nov. 1994, pp. 1359–1365.

* cited by examiner

Primary Examiner—Dinh T. Le
(74) Attorney, Agent, or Firm—Larry L. Parker

(57) ABSTRACT

An output driver circuit (10) includes a voltage follower (36) having an input coupled for receiving a reference signal ($V_{REF1}$) and an output for providing an output signal ($V_{OUT}$). The output driver circuit (10) further includes an amplifier (28) that compares the voltages of the reference ($V_{REF1}$) and output ($V_{OUT}$) signals to generate a compare signal for enabling a conduction path (37). The conduction path (37) alters the voltage of the output signal ($V_{OUT}$) so that the transition time of the output signal ($V_{OUT}$) is substantially equal to the transition time of the reference signal ($V_{REF1}$).

15 Claims, 2 Drawing Sheets

DRIVER CIRCUIT AND METHOD FOR CONTROLLING TRANSITION TIME OF A SIGNAL

FIELD OF THE INVENTION

The present invention relates, in general, to integrated circuits and, more particularly, to driver circuits for integrated circuit pads.

BACKGROUND OF THE INVENTION

Integrated circuits have metal pads for interconnection to circuitry external to the integrated circuit. The metal pads of the integrated circuit are coupled for sending and receiving input and output signals. The metal pads are the interface circuitry between circuitry external and internal to the integrated circuit.

Integrated circuits have output driver circuitry for transmitting output signals from the integrated circuit. The output driver circuitry is necessary because of capacitance loads that appear at the metal pad when the integrated circuit is interconnected with other circuitry. The output driver charges and discharges the capacitive load to a predetermined voltage level within a specified time interval.

A conventional output driver has two series connected transistors, a pull-up transistor and a pull-down transistor. The pull-up transistor is used to drive the pad to a logic high voltage level, referred to as a logic 1. The pull-down transistor is used to drive the pad to a logic low voltage level, referred to as a logic 0. For sub-micron semiconductor devices employing a conventional output driver, many factors can adversely affect the transition times, i.e., the rise and fall times, of the output signal between binary logic voltage levels. These factors include the process used for fabrication (e.g., bipolar vs. Complementary Metal Oxide Semiconductor (CMOS)), operating temperatures, load capacitance, and power supply voltages. Any variations in one of these factors, such as a change in the load capacitance, will cause the rise and fall times of the output signal to vary. The transition time of a signal is also referred to as a slew rate of the signal.

Accordingly, it would be advantageous to have an output driver for sub-micron semiconductor devices that generates output signals having controlled rise and fall times. It would be of further advantage for the output driver to be area efficient and compatible with standard semiconductor processes.

DETAILED DESCRIPTION OF THE DRAWINGS

Figure 1:
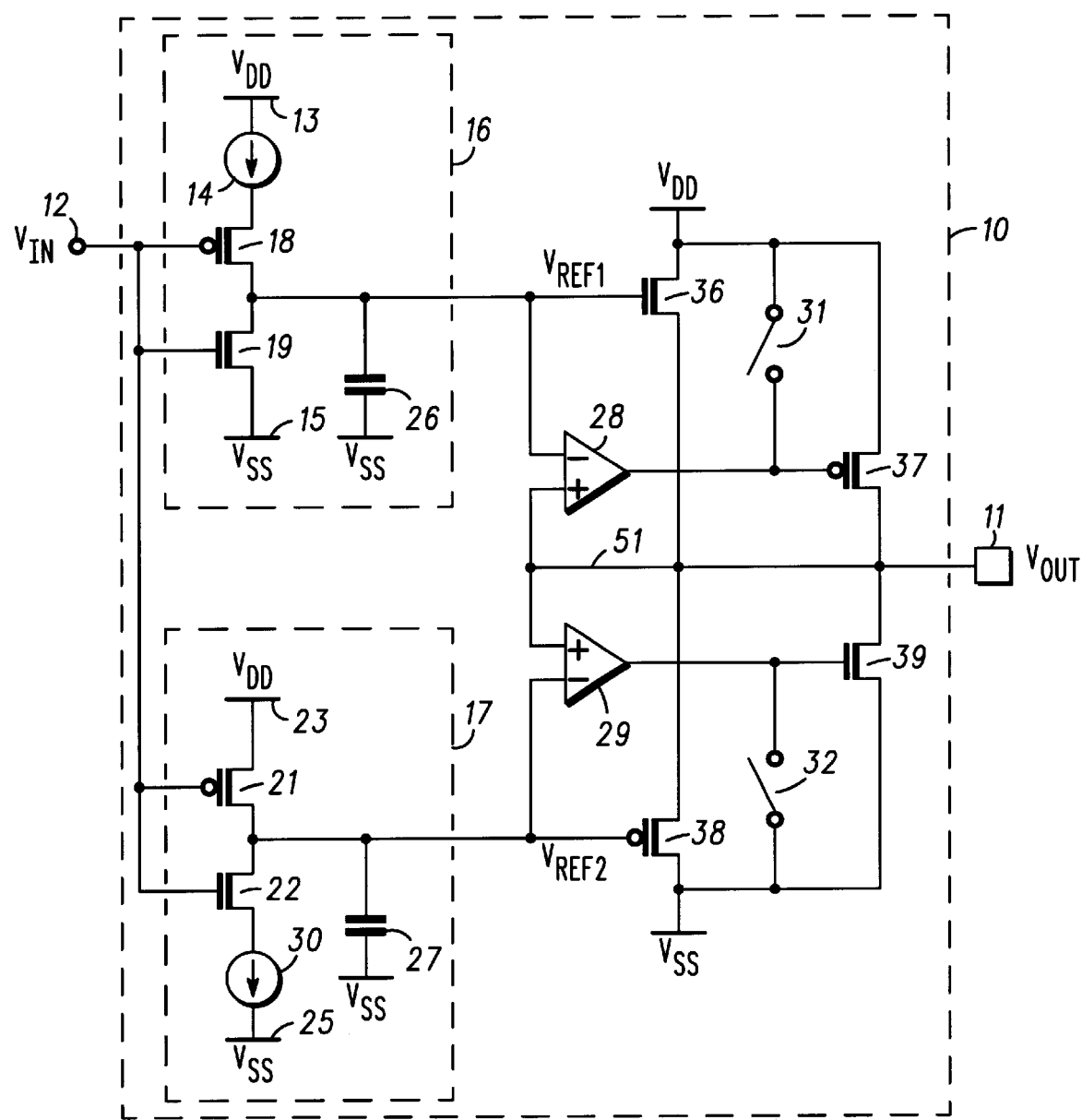
FIG. 1 is a schematic diagram of an output circuit coupled to an output pad.

FIG. 1 is a schematic diagram of an output circuit 10, also referred to as an output driver circuit, coupled to an output pad 11. Output circuit 10 receives an input signal labeled $V_{IN}$ at an input terminal 12 and provides an output signal labeled $V_{OUT}$ at pad 11. Signals $V_{IN}$ and $V_{OUT}$ may contain data for transmission to circuitry external to circuit 10 and therefore can be referred to as data signals.

Output circuit 10 includes slope generators 16 and 17. Slope generators 16 and 17 affect the slope of signal $V_{OUT}$. In particular, slope generator 16 affects the rise time of signal $V_{OUT}$ and is referred to as a positive slope generator. Slope generator 17 affects the fall time of signal $V_{OUT}$ and is referred to as a negative slope generator.

Slope generator 16 includes a p-channel Field Effect Transistor (FET) 18 and an n-channel FET 19. The gate electrodes of FETs 18 and 19 are coupled for receiving signal $V_{IN}$. The source electrode of FET 18 is coupled to a power supply terminal 13 for receiving a source of operating potential or power supply voltage such as, for example, supply voltage $V_{DD}$, via a current source 14. The source electrode of FET 19 is coupled to a power supply terminal 15 for receiving a power supply voltage such as, for example, supply voltage $V_{SS}$. By way of example, supply voltage $V_{DD}$ is approximately five volts and supply voltage $V_{SS}$ is approximately zero volts. The drain electrode of FET 18 is connected to the drain electrode of FET 19. Slope generator 16 further includes a capacitor 26. Capacitor 26 has a first terminal connected to the drain electrodes of FETs 18 and 19 and a second terminal coupled for receiving power supply voltage $V_{SS}$.

Slope generator 17 includes a p-channel FET 21 and an n-channel FET 22. The gate electrodes of FETs 21 and 22 are coupled for receiving signal $V_{IN}$. The source electrode of FET 21 is coupled to a power supply terminal 23 for receiving power supply voltage $V_{DD}$. The source electrode of FET 22 is coupled to a power supply terminal 25 for receiving power supply voltage $V_{SS}$ via a current source 30. The drain electrodes of FETs 21 and 22 are connected to each other. Slope generator 17 further includes a capacitor 27. Capacitor 27 has a first terminal connected to the drain electrodes of FETs 21 and 22 and a second terminal coupled for receiving power supply voltage $V_{SS}$.

Although transistors 18, 19, 21, and 22 are shown as FETS, this is not a limitation of the present invention. For example, transistors 18, 19, 21, and 22 can be bipolar transistors. Transistors used in output circuit 10 are understood to provide a conduction path between first and second conduction electrodes when a control signal is applied to a control electrode. It should be noted that the gate electrode of a FET is referred to as a control electrode and the drain and source electrodes of a FET are referred to as current carrying electrodes or conduction electrodes. Likewise, the base of a bipolar transistor is referred to as the control electrode and the collector and emitter electrodes of the bipolar transistor are referred to as conduction electrodes.

Output circuit 10 further includes amplifiers 28 and 29, switches 31 and 32, and FETs 36–39. An inverting input terminal of amplifier 28 is connected to the first terminal of capacitor 26 and a noninverting input terminal of amplifier 28 is connected to pad 11 via a feedback path 51. FET 36 is an n-channel FET having a gate electrode connected to the first terminal of capacitor 26, a drain electrode coupled for receiving supply voltage $V_{DD}$, and a source electrode connected to pad 11. FET 37 is a p-channel FET having a gate electrode connected to the output terminal of amplifier 28, a drain electrode coupled for receiving supply voltage $V_{DD}$, and a source electrode connected to pad 11. Switch 31 is connected between the gate of FET 37 and supply voltage $V_{DD}$.

An inverting input terminal of amplifier 29 is connected to the first terminal of capacitor 27 and a noninverting input terminal of amplifier 29 is connected to pad 11. FET 38 is a p-channel FET having a gate electrode connected to the first terminal of capacitor 27, a drain electrode coupled for receiving power supply voltage $V_{SS}$, and a source electrode connected to a pad 11. FET 39 is an n-channel FET having a gate electrode connected to the output terminal of amplifier 29, a drain electrode coupled for receiving power supply voltage $V_{SS}$, and a source electrode connected to pad 11. Switch 32 is connected between the gate electrode of FET 39 and power supply voltage $V_{SS}$.

Output circuit 10 can be fabricated using a semiconductor process that can integrate both bipolar and Metal Oxide Semiconductor (MOS) transistors on the same semiconductor die. The principles of the present invention are not limited to such a process, but can equally be applied to other semiconductor processes as well.

FETs 18 and 19 charge and discharge capacitor 26 based on the voltage level of signal $V_{IN}$. When the voltage of input signal $V_{IN}$ at input terminal 12 switches from a logic high voltage level, e.g., voltage $V_{DD}$, to a logic low voltage level, e.g., voltage $V_{SS}$, FET 18 is switched on and FET 19 is switched off. Thus, FET 18 is conductive, i.e., a conduction path from the source electrode of FET 18 to the drain electrode of FET 18 is enabled. Therefore, a charging current flowing through FET 18 charges capacitor 26, thereby increasing the voltage of a reference signal $V_{REF1}$. As capacitor 26 is charged, the voltage of signal $V_{REF1}$, rises from approximately voltage $V_{SS}$ to approximately voltage $V_{DD}$ The operation of output circuit 10 is further described with reference to FIG. 2.

Figure 2:
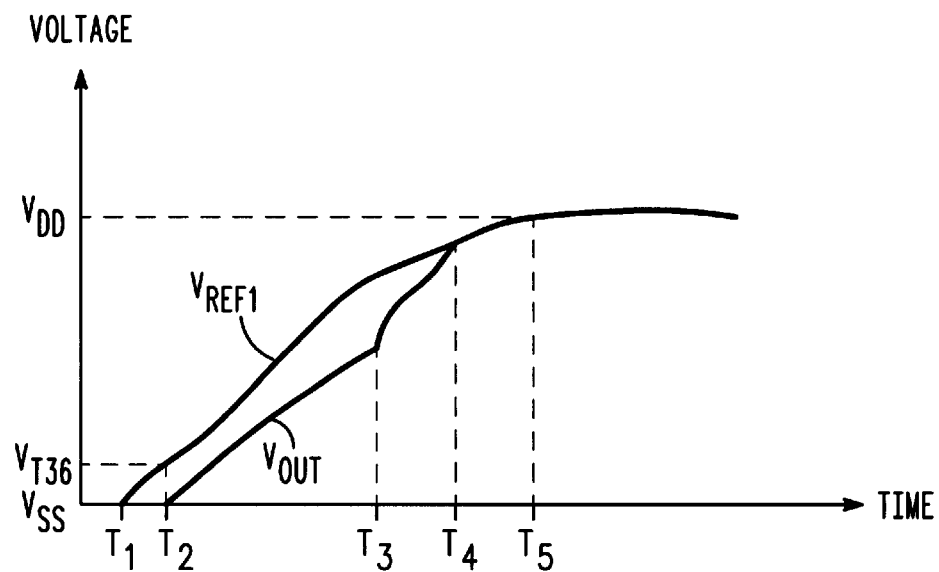
FIG. 2 is a graph of a first reference signal and an output signal of the output circuit of FIG. 1.

FIG. 2 is a graph of signals $V_{REF1}$ and $V_{OUT}$ of output circuit 10. It should be understood that the same reference numerals are used in the figures to denote the same elements. Although not shown in FIG. 2, the voltage of signal $V_{IN}$ remains at a logic low voltage level between times $T_1$ and $T_5$ so that FET 18 (FIG. 1) is on and FET 19 is off. What is shown in FIG. 2 is signal $V_{REF1}$ rising from an initial voltage level of $V_{SS}$ at time $T_1$ to a final voltage level of $V_{DD}$ at time $T_5$. The time it takes for signal $V_{REF1}$ to rise from an initial voltage level of $V_{SS}$ to a final voltage level of $V_{DD}$ is referred to as the rise time of signal $V_{REF1}$. The rise time of signal $V_{REF1}$ is the time between times $T_1$ and $T_5$. Those skilled in the art will understand that rise time may also mean the time it takes for a signal to rise from ten percent of its final voltage level to ninety percent of its final voltage level. The rise time of signal $V_{REF1}$, is set by a charging current through FET 18 and the capacitance of capacitor 26. In other words, the rise time of signal $V_{REF1}$ is equal to the amount of time it takes to charge capacitor 26 to a final voltage level of approximately $V_{DD}$. Thus, the rise time of signal $V_{REF1}$ is a function of the capacitance of capacitor 26 and the amount of charging current supplied by current source 14. For example, increasing the capacitance of capacitor 26 and/or decreasing the amount of charging current supplied by current source 14 can increase the rise time of signal $V_{REF1}$. On the other hand, decreasing the capacitance of capacitor 26 and/or increasing the amount of charging current supplied by current source 14 can decrease the rise time of signal $V_{REF1}$. It should be understood that the gate electrode of FET 36 has capacitance that will affect the rise time of $V_{REF1}$.

Referring to FIGS. 1 and 2, at time $T_2$, the voltage of signal $V_{REF1}$ increases to a level greater than the threshold voltage of FET 36 (denoted as $VT_{36}$ in FIG. 2), and FET 36 turns on and is conductive. The voltage of signal $V_{OUT}$ begins to rise from an initial voltage level of approximately $V_{SS}$. FET 36 is operated as a voltage follower. In this embodiment, FET 36 is a Metal Oxide Semiconductor Field Effect Transistor (MOSFET) configured as a source follower, wherein the gate electrode or input is coupled to the first terminal of capacitor 26 and the source electrode or output provides a follower voltage at output pad 11. Alternatively, transistor 36 can be another type of device that performs a voltage follower function. For example, transistor 36 can be implemented as a bipolar transistor operating as an emitter follower, wherein the base electrode of the bipolar transistor serves as an input and the emitter electrode serves as the output for providing a follower voltage. FET 36 is configured to charge a capacitive load (not shown) at output pad 11 with little or no delay so that the follower voltage at the output of FET 36, i.e., signal $V_{OUT}$, closely tracks the voltage at the input of FET 36, i.e., signal $V_{REF1}$.

Preferably, amplifier 28 is enabled or active after the voltage of $V_{REF1}$ rises above the threshold voltage of FET 36 at time $T_2$. The bandwidth and the input common mode range of amplifier 28 can be modified to delay enabling amplifier 28 and to increase stability of the loop formed by amplifier 28 and FET 37.

In this embodiment, amplifier 28 is enabled at time $T_3$. When amplifier 28 is enabled, amplifier 28 compares the voltage at its inverting and noninverting input terminals to generate a compare signal at its output terminal for enabling a conduction path between the source and drain electrodes of FET 37. FET 37 alters the voltage of signal $V_{OUT}$ so that the transition time of signal $V_{OUT}$ is substantially equal to the transition time of the signal $V_{REF1}$.

At time $T_3$, amplifier 28 compares signal $V_{REF1}$ received at its inverting input terminal to signal $V_{OUT}$ received at its noninverting input terminal. Signal $V_{OUT}$ is received at the noninverting input terminal of amplifier 28 via feedback path 51. Since the voltage of signal $V_{REF1}$, is greater than the voltage of signal $V_{OUT}$, a logic low voltage is transmitted from the output terminal of amplifier 28 to the gate electrode of FET 37. Therefore, FET 37 is on and conducts a current through FET 37 for charging the load capacitance at output pad 11, thereby increasing the voltage of signal $V_{OUT}$ towards the voltage of signal $V_{REF1}$.

Between times $T_3$ and $T_4$ the voltages of signals $V_{REF1}$ and $V_{OUT}$ increase towards supply voltage of Between times $T_4$ and $T_5$ the voltage of signal $V_{OUT}$ is substantially equal to the voltage of signal $V_{REF1}$. At time $T_5$, the voltages of signals $V_{REF1}$ and $V_{OUT}$ are approximately equal to supply voltage $V_{DD}$.

Amplifier 28 and FET 37 regulate the voltage of signal $V_{OUT}$ so that the voltages of signals $V_{REF1}$ and $V_{OUT}$ remain substantially equal after time $T_4$. That is, after time $T_3$, amplifier 28 continuously compares signals $V_{REF1}$ and $V_{OUT}$ and generates a compare signal at the output terminal of amplifier 28 for turning FET 37 on as long as amplifier 28 is active. When the voltage of signal $V_{REF1}$ is greater than the voltage of signal $V_{OUT}$, amplifier 28 transmits a logic low voltage from the output terminal of amplifier 28 to the gate electrode of FET 37, which turns FET 37 on and increases the voltage of signal $V_{OUT}$.

Since the voltage of signal $V_{OUT}$ tracks the voltage of signal $V_{OUT}$ and amplifier 28 and FET 37 regulate the voltage of signal $V_{OUT}$, the rise time of signal $V_{OUT}$ is substantially equal to the rise time of signal $V_{REF1}$. Therefore, similar to the rise time of $V_{REF1}$ discussed hereinbefore, the rise time of signal $V_{OUT}$ is a function of the capacitance of capacitor 26 and the amount of current supplied by current source 14. Thus, a circuit designer can control or predetermine the rise time of signal $V_{OUT}$ with current source 14 and the capacitance of capacitor 26, independent of the capacitive load at pad 11.

Figure 3:
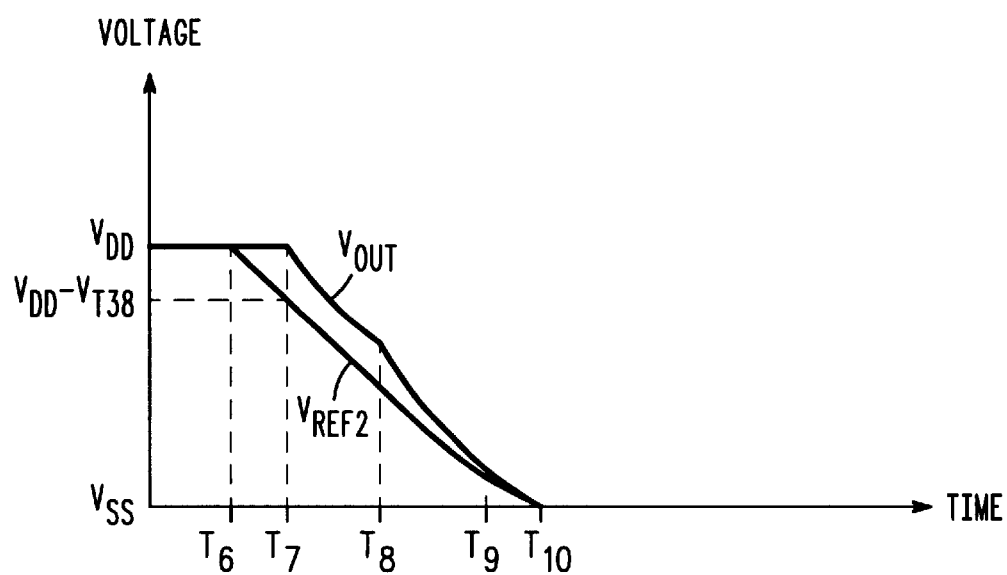
FIG. 3 is a graph of a second reference signal and the output signal of the output circuit of FIG. 1.

FIG. 3 is a graph of signals $V_{REF1}$ and $V_{OUT}$ of output circuit 10. Referring to FIGS. 1 and 3, signal $V_{IN}$ is at a logic low voltage level prior to time $T_6$. Thus, FET 21 is conductive and FET 22 is nonconductive. A current flowing through FET 21 charges capacitor 27 and increases the voltage of signal $V_{REF2}$ to a voltage approximately equal to supply voltage $V_{DD}$. As discussed hereinbefore, the voltage of signal $V_{OUT}$ rises to a voltage level equal to approximately supply voltage $V_{DD}$ when signal $V_{IN}$ is at a logic low voltage level.

At time $T_6$, $V_{IN}$ switches from a logic low voltage level to a logic high voltage level. FET 22 is switched on and FET 21 is switched off. A current flowing through FET 22 discharges capacitor 27, which causes the voltage of signal $V_{REF2}$ to decrease from supply voltage $V_{DD}$, towards supply voltage $V_{SS}$. The voltage of signal $V_{IN}$ remains at a logic high voltage level between times $T_6$ and $T_{10}$ so that FET 22 remains conductive and FET 21 remains nonconductive.

Between times $T_6$ and $T_{10}$, the voltage of signal $V_{REF2}$ decreases from supply voltage $V_{DD}$ to supply voltage $V_{SS}$. The time it takes for signal $V_{REF2}$ to decrease from supply voltage $V_{DD}$ to supply voltage $V_{SS}$ is referred to as the fall time of signal $V_{REF2}$. Therefore, the fall time of signal $V_{REF2}$ is the time between times $T_6$ and $T_{10}$. Those skilled in the art will understand that fall time may also mean the time it takes for a signal to fall from ninety percent of its final voltage level to ten percent of its final voltage level. The fall time of signal $V_{REF2}$ is set by the discharging current through FET 22 and the capacitance of capacitor 27. In other words, the fall time of signal $V_{REF2}$ is equal to the amount of time it takes to discharge capacitor 27 to a final voltage level of approximately $V_{SS}$. Thus, the fall time of signal $V_{REF2}$ is a function of the capacitance of capacitor 27 and the amount of current sunk by current source 30. For example, increasing the capacitance of capacitor 27 and/or decreasing the amount of discharging current through FET 22 using current source 30 can increase the fall time of signal $V_{REF2}$. On the other hand, the fall time of signal $V_{REF2}$ can be decreased by decreasing the capacitance of capacitor 27 and/or increasing the amount of discharging current through FET 22 using current source 30. It should be understood that the gate electrode of FET 38 has capacitance that will affect the fall time of $V_{REF2}$.

At time $T_7$, the voltage of signal $V_{REF2}$ decreases to a level less than the threshold voltage of FET 38 (denoted as $V_{DD}-V_{T38}$ in FIG. 2), and FET 38 turns on and is conductive. The voltage of signal $V_{OUT}$ begins to decrease from voltage $V_{DD}$.

Preferably, amplifier 29 is enabled or active after the voltage of $V_{REF2}$ falls below the threshold voltage of FET 38 at time $T_7$. The bandwidth and the input common mode range of amplifier 29 can be modified to delay enabling amplifier 29 and to increase stability of the loop formed by amplifier 29 and FET 39.

In this embodiment, amplifier 29 is enabled at time $T_8$. When amplifier 29 is enabled, amplifier 29 compares the voltage at its inverting and noninverting input terminals to generate a compare signal at its output terminal for enabling a conduction path between the drain and source electrodes of FET 39. At time $T_8$, amplifier 29 compares signal $V_{REF2}$ received at its inverting input terminal to signal $V_{OUT}$ received at its noninverting input terminal. Signal $V_{OUT}$ is received at the noninverting input terminal of amplifier 29 via feedback path 51. Since the voltage of signal $V_{OUT}$ is greater than the voltage of signal $V_{REF2}$, a logic high voltage is transmitted from the output terminal of amplifier 29 to the gate electrode of FET 39. Therefore, FET 39 is on and conducts a current through FET 39 for discharging the load capacitance at output pad 11, thereby decreasing the voltage of signal $V_{OUT}$ towards the voltage of signal $V_{REF2}$.

Between times $T_8$ and $T_9$, the voltages of signals $V_{REF2}$ and $V_{OUT}$ decrease towards supply voltage $V_{SS}$. Between times $T_9$ and $T_{10}$, the voltage of signal $V_{OUT}$ is substantially equal to the voltage of signal $V_{REF2}$. At time $T_{10}$ the voltages of signals $V_{REF2}$ and $V_{OUT}$ are approximately equal to supply voltage $V_{SS}$.

Amplifier 29 and FET 39 regulate the voltage of signal $V_{OUT}$ so that the voltages of signals $V_{REF2}$ and $V_{OUT}$ remain substantially equal after time $T_9$. That is, after time $T_8$, amplifier 29 continuously compares signals $V_{REF2}$ and $V_{OUT}$ and generates a compare signal at the output terminal of amplifier 29 for turning FET 39 on as long as amplifier 29 is active.

As shown in FIG. 3, the fall time of signal $V_{OUT}$ is approximately equal to the fall time of signal $V_{REF2}$. Therefore, similar to the fall time of $V_{REF2}$ discussed hereinbefore, the fall time of signal $V_{OUT}$ is a function of the capacitance of capacitor 27 and the amount of discharge current through FET 22. Thus, a circuit designer can control or predetermine the fall time of signal $V_{OUT}$ with the capacitance of capacitor 27 and current source 30.

Without amplifier 28 and FET 37 regulating the voltage of signal $V_{OUT}$, the maximum voltage level of signal $V_{OUT}$ would be limited to the supply voltage $V_{DD}$ minus the threshold voltage of FET 36. Similarly, without amplifier 29 and FET 39, the minimum voltage level of signal $V_{OUT}$ would be limited to the supply voltage $V_{SS}$ plus the threshold voltage of FET 38. An advantage of circuit 10 is that it provides an output signal that has an output voltage swing between the supply voltages $V_{DD}$ and $V_{SS}$. This is desirable in applications such as CMOS logic applications that require a rail-to-rail output voltage swing. A rail-to-rail output voltage swing means that the maximum and minimum voltage levels of the output signal are substantially equal to the power supply voltages of the integrated circuit.

Optionally, switches 31 and 32 are included in output circuit 10. Switch 32 is preferably closed when signal $V_{IN}$ is at a logic low voltage so that the gate electrode of FET 39 is pulled to supply voltage $V_{SS}$ and FET 39 is nonconductive. Switch 31 is preferably closed when signal $V_{IN}$ is at a logic high voltage so that the gate electrode of FET 37 is pulled to supply voltage $V_{DD}$ and FET 37 is nonconductive.

Amplifiers 28 and 29 can be current comparators for high speed applications, e.g., applications having transition times of three to five nanoseconds.

Current sources 14 and 30 can be designed to be temperature independent current sources by using a bandgap generated current reference. Further, the current sources can be matched using current mirror circuits.

By now it should be appreciated that a driver circuit and a method for controlling transition times of an output signal of the driver circuit have been provided. An advantage of the present invention is that it provides a circuit and method for generating signals having predetermined transition times that are not affected by variations in temperature, load capacitance, power supply voltages, or fabrication process. Another advantage of the present invention is that it provides a circuit for high speed applications. In addition, the present invention provides a circuit for generating output signals that have an output voltage swing between the power supply voltages of the circuit.

What is claimed is:

1. A circuit, comprising:
    an amplifier having a first input for receiving a reference voltage, a second input, and an output;
    a voltage follower having an input coupled for receiving the reference voltage and an output coupled to an output of the circuit for providing an output voltage;
    a conduction path coupled between a power supply terminal and the output of the circuit, wherein the output of the amplifier is coupled to the conduction path for controlling the conduction path; and
    a feedback path coupled between the output of the circuit and the second input of the amplifier.

2. The circuit of claim 1, wherein the conduction path includes a transistor having a control electrode coupled to the output of the amplifier, a first conduction electrode coupled to the power supply terminal, and a second conduction electrode coupled to the output of the circuit.

3. The circuit of claim 2, wherein the transistor is a p-channel field effect transistor.

4. The circuit of claim 1, wherein the voltage follower includes a transistor having a control electrode coupled for receiving the reference voltage, a first conduction electrode coupled to the power supply terminal, and a second conduction electrode coupled to the output of the circuit.

5. The circuit of claim 4, wherein the transistor is an n-channel field effect transistor.

6. The circuit of claim 1, further comprising:
    a second amplifier having a first input coupled for receiving a second reference voltage, a second input coupled to the output of the circuit, and an output; and
    a second conduction path coupled between a second power supply terminal and the output of the circuit, wherein the output of the second amplifier is coupled to the second conduction path for controlling the second conduction path.

7. The circuit of claim 6, wherein the second conduction path includes an n-channel field effect transistor having a control electrode coupled to the output of the second amplifier, a first conduction electrode coupled to the second power supply terminal, and a second conduction electrode coupled to the output of the circuit.

8. The circuit of claim 6, further comprising a transistor having a control electrode coupled for receiving the second reference voltage, a first conduction electrode coupled to the second power supply terminal, and a second conduction electrode coupled to the output of the circuit.

9. The circuit of claim 6, further comprising a capacitor having a first terminal coupled for receiving the second reference voltage and a second terminal coupled for receiving a power supply voltage.

10. A circuit, comprising:
    an amplifier having a first input for receiving a reference voltage and an output;
    a voltage follower having an input coupled for receiving the reference voltage and an output coupled to an output of the circuit for providing an output voltage;
    a conduction path coupled between a power supply terminal and the output of the circuit, wherein the output of the amplifier is coupled to the conduction path for controlling the conduction path; and
    a capacitor having a first terminal coupled to the input of the voltage follower and a second terminal coupled for receiving a power supply voltage.

11. A method for controlling a transition time of a data signal, comprising:
    providing a reference signal;
    comparing a voltage of the reference signal with a voltage of the data signal to enable a conduction path to alter the voltage of the data signal so that the transition time of the data signal is substantially equal to a transition time of the reference signal, and
    generating the data signal using a voltage follower, wherein the voltage of the data signal tracks the voltage of the reference signal, wherein providing the reference signal includes:
        enabling a second conduction path to provide a charging current; and
        charging a capacitance with the charging current, wherein the transition time of the reference signal is a function of the charging current and the capacitance.

12. The method of claim 11, further including increasing a rise time of the reference signal by decreasing the charging current.

13. The method of claim 12, further including:
    providing a second reference signal, wherein a fall time of the data signal is substantially equal to a fall time of the second reference signal; and
    decreasing the fall time of the second reference signal by
    enabling a third conduction path to provide a discharging current to discharge a second capacitance so that a voltage of the second reference signal decreases, and
    increasing the discharging current.

14. The method of claim 11, further including decreasing a rise time of the reference signal by increasing the charging current.

15. A circuit, comprising:
    a comparator having a first input coupled to an input of the circuit, a second input coupled to an output of the circuit, and an output;
    a first transistor having a control electrode coupled to the first input of the comparator, a first conduction electrode coupled for receiving a power supply voltage, and a second conduction electrode coupled to the second input of the comparator; and
    a second transistor having a control electrode coupled to the output of the comparator, a first conduction electrode coupled for receiving the power supply voltage, and a second conduction electrode coupled to the second input of the comparator.

* * * * *